US 011570941B2

(12) United States Patent
Terasawa

(10) Patent No.: US 11,570,941 B2
(45) Date of Patent: Jan. 31, 2023

(54) COMPONENT FEEDING DEVICE AND COMPONENT FEEDING METHOD

(71) Applicant: FUJI CORPORATION, Chiryu (JP)

(72) Inventor: Shinya Terasawa, Nagoya (JP)

(73) Assignee: FUJI CORPORATION, Chiryu (JP)

( * ) Notice: Subject to any disclaimer, the term of this patent is extended or adjusted under 35 U.S.C. 154(b) by 340 days.

(21) Appl. No.: 16/768,787

(22) PCT Filed: Dec. 12, 2017

(86) PCT No.: PCT/JP2017/044519
§ 371 (c)(1),
(2) Date: Jun. 1, 2020

(87) PCT Pub. No.: WO2019/116442
PCT Pub. Date: Jun. 20, 2019

(65) Prior Publication Data
US 2021/0176906 A1 Jun. 10, 2021

(51) Int. Cl.
*H05K 13/08* (2006.01)
*B65G 47/14* (2006.01)
(Continued)

(52) U.S. Cl.
CPC ....... *H05K 13/086* (2018.08); *B65G 47/1492* (2013.01); *B65G 47/912* (2013.01); *H05K 13/028* (2013.01); *H05K 13/043* (2013.01)

(58) Field of Classification Search
CPC .. H05K 13/021; H05K 13/022; H05K 13/028; H05K 13/043; H05K 13/0434;
(Continued)

(56) References Cited

U.S. PATENT DOCUMENTS 10,206,318 B2 * 2/2019 Matsumoto ........ H05K 13/0452
10,264,719 B2 * 4/2019 Iwaki .................... H05K 13/028
(Continued)

FOREIGN PATENT DOCUMENTS

EP 0 916 457 A2 5/1999
JP 2010-228819 A 10/2010
(Continued)

OTHER PUBLICATIONS

International Search Report dated Feb. 6, 2018 in PCT/JP2017/044519 filed Dec. 12, 2017, 1 page.

*Primary Examiner* — Peter Dungba Vo
*Assistant Examiner* — Joshua D Anderson
(74) *Attorney, Agent, or Firm* — Oblon, McClelland, Maier & Neustadt, L.L.P.

(57) ABSTRACT

There is provided a component feeding device including multiple component replenishing devices configured to replenish with components having different shapes; multiple stages on which the components replenished from the multiple replenishing devices are scattered, and a control section configured to cause the multiple replenishing devices to replenish the components to the respective stages at an arbitrary timing. There is provided a component feeding method for supplying components, having different shapes and being respectively replenished onto multiple stages from multiple replenishing devices, to a component mounting device with the components being respectively scattered on the multiple stages, wherein amounts of the components is capable of being respectively changed for each of the multiple stages.

6 Claims, 12 Drawing Sheets

(51) Int. Cl.
  *B65G 47/91* (2006.01)
  *H05K 13/02* (2006.01)
  *H05K 13/04* (2006.01)
(58) Field of Classification Search
  CPC .............. H05K 13/086; Y10T 29/4913; Y10T 29/53174; Y10T 29/53178; Y10T 29/53183; B65G 47/12; B65G 47/14; B65G 47/1478; B65G 47/1485; B65G 47/1492; B65G 47/16; B65G 47/905; B65G 47/912; B65G 47/917
  See application file for complete search history.

(56) References Cited

U.S. PATENT DOCUMENTS

| | | | |
|---|---|---|---|
| 2010/0249991 A1* | 9/2010 | Asano | B65G 47/5145 |
| | | | 700/218 |
| 2016/0192546 A1* | 6/2016 | Teraoka | H05K 13/086 |
| | | | 414/806 |

FOREIGN PATENT DOCUMENTS

| | | | | |
|---|---|---|---|---|
| WO | WO-2016071984 A1 * | 5/2016 | .............. | B23P 19/00 |
| WO | WO-2016139742 A1 * | 9/2016 | ........... | H05K 13/022 |
| WO | WO 2017/208323 A1 | 12/2017 | | |
| WO | WO 2017/208325 A1 | 12/2017 | | |

\* cited by examiner

COMPONENT FEEDING DEVICE AND COMPONENT FEEDING METHOD

TECHNICAL FIELD

The present application relates to a component feeding device or the like which includes a replenishing device for replenishing components and a stage on which components replenished from the replenishing device are scattered.

BACKGROUND ART

As described in a patent literature raised below as a reference, some component feeding devices supply components in such a state that components are scattered on a stage.

PATENT LITERATURE

Patent Literature 1: JP-A-2010-228819

BRIEF SUMMARY

Technical Problem

The above mentioned patent literature describes the components being supplied on a single stage but does not describe that of being supplied on multiple stages. Then, a technical problem that the present disclosure is to solve is how to supply components on each of multiple stages in a preferred manner.

Solution to Problem

With a view to solving the problem, according to the description of the disclosure, there is disclosed a component feeding device including multiple component replenishing devices configured to replenish with components having different shapes, multiple stages on which the components replenished from the multiple replenishing devices are scattered, and a control section configured to cause the multiple replenishing devices to replenish the components to the respective stages at an arbitrary timing.

With a view to solving the problem, according to the description, there is disclosed a component feeding method for supplying components, having different shapes and being respectively replenished onto multiple stages from multiple replenishing devices, to a component mounting device with the components being respectively scattered on the multiple stages, wherein amounts of the components can be respectively changed for each of the multiple stages.

Advantageous Effects

According to the disclosure, the components can be replenished from the multiple replenishing devices onto the respective stages at the arbitrary timings. Also, according to the disclosure, the amounts of components replenished from the replenishing devices onto the respective stages can be changed for each of the multiple stages.

DESCRIPTION OF EMBODIMENT

Hereinafter, with referring to drawings, an embodiment of the disclosure will be described as exemplary embodiments of the present disclosure.

(A) Component Mounting Machine Configuration

Figure 1:
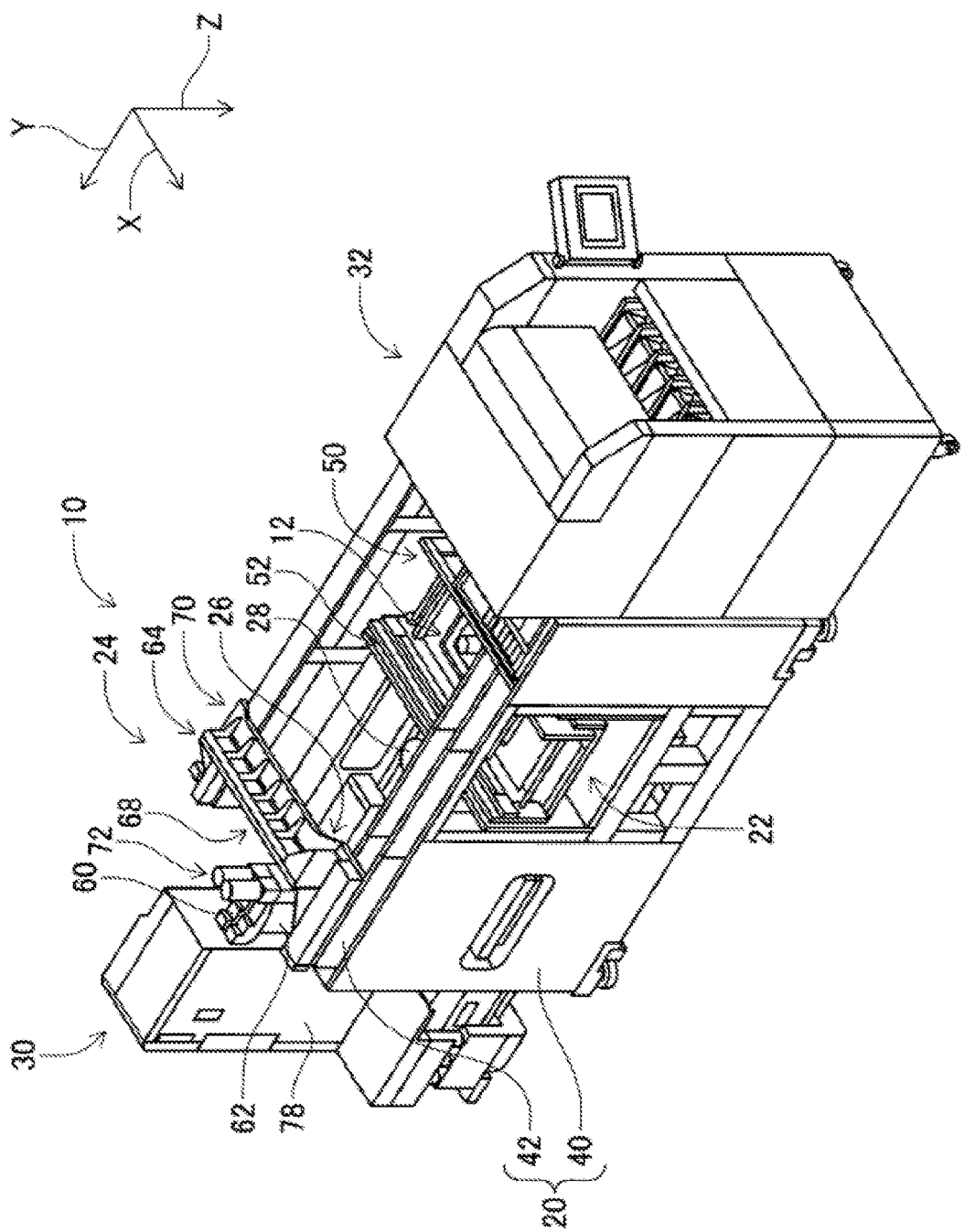
FIG. 1 is a perspective view showing a component mounting machine.

FIG. 1 shows component mounting machine 10. Component mounting machine 10 constitutes a device for executing mounting work of mounting components on circuit substrate 12. Component mounting machine 10 includes device main body 20, substrate conveyance and holding device 22, component mounting device 24, imaging devices 26, 28, component feeding device 30, bulk component feeding device 32, and control device (refer to FIG. 11) 34. A circuit board, a substrate having a three-dimensional structure, and the like are raised as circuit substrate 12, and a printed wiring board, a printed circuit board, and the like are raised as a circuit board.

Device main body 20 is made up of frame section 40 and beam section 42 mounted on frame section 40. Substrate conveyance and holding device 22 is disposed at a center of frame section 40 in a front-rear direction thereof and includes conveyance device 50 and clamping device 52. Conveyance device 50 constitutes a device for conveying circuit substrate 12, and clamping device 52 constitutes a device for holding circuit substrate 12. As a result, substrate conveyance and holding device 22 not only conveys circuit substrate 12 but also fixedly holds circuit substrate 12 in a predetermined position. In the following description, the conveyance direction of circuit substrate 12 is referred to as an X direction, a horizontal direction orthogonal to the conveyance or X direction is referred to a Y direction, and a vertical direction is referred to as a Z direction. That is, the X direction constitutes a width direction of component mounting machine 10, and the Y direction constitutes the front-rear direction thereof.

Figure 2:
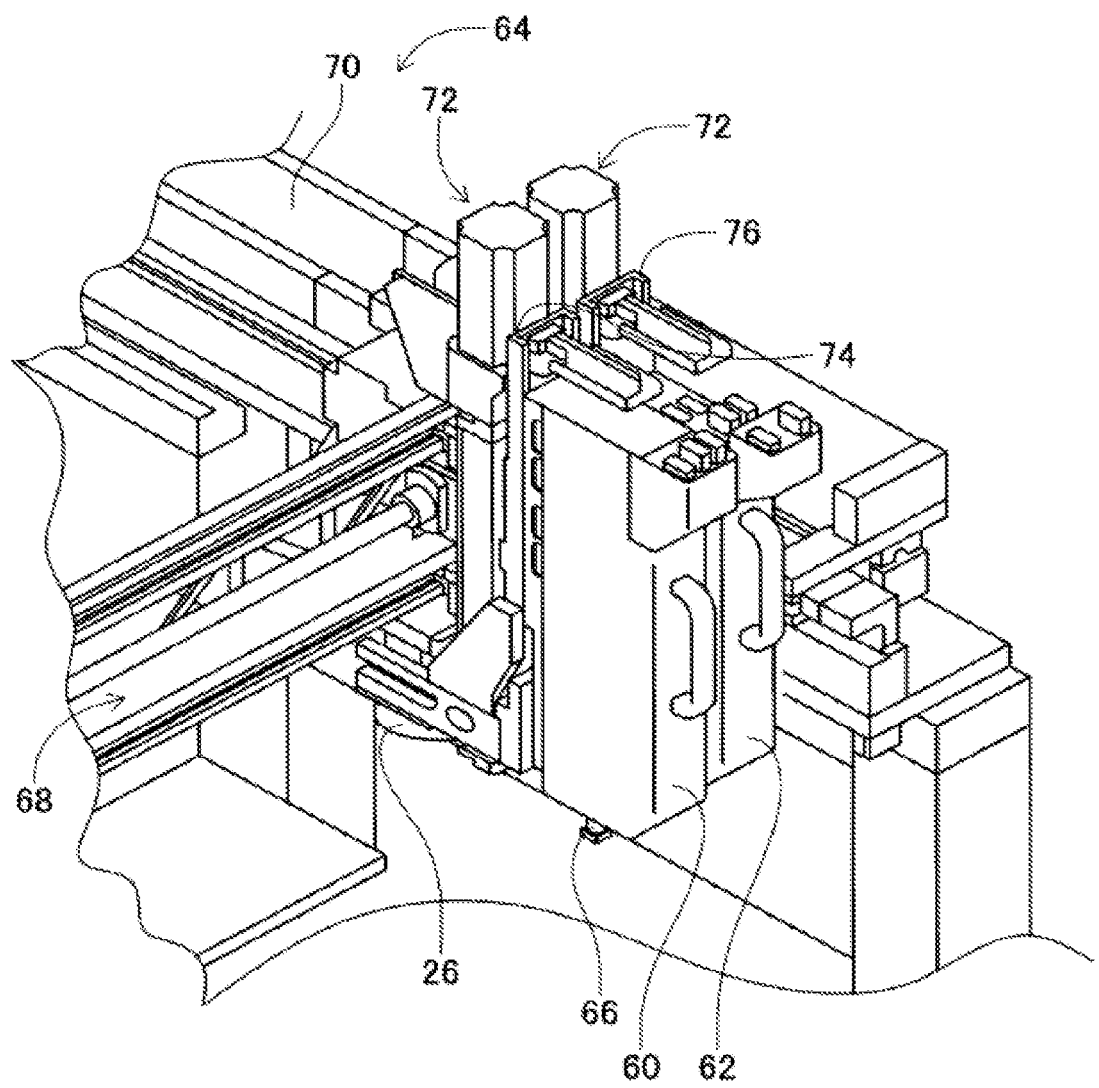
FIG. 2 is a perspective view showing a component mounting device of the component mounting machine.

Component mounting device 24 is disposed in beam section 42 and includes two work heads 60, 62 and work head moving device 64. Each of work heads 60, 62 has suction nozzle (refer to FIG. 2) 66 and holds a component using suction nozzle 66. Further, working head moving device 64 includes X-direction moving device 68, Y-direction moving device 70, and Z-direction moving devices 72. Then, two working heads 60, 62 are caused to move together to an arbitrary position over frame section 40 by X-direction moving device 68 and Y-direction moving device 70. As shown in FIG. 2, work heads 60, 62 are detachably attached to sliders 74, 76, respectively, and Z-direction moving devices 72 move individually respective sliders 74, 76 in an up-down direction. That is, working heads 60, 62 are caused to move individually in the up-down direction by respective Z-direction moving devices 72.

Imaging device 26 is attached to slider 74 in such a state that imaging device 26 is directed downwards and is caused to move in the X direction, Y direction, and Z direction together with working head 60. As a result, imaging device 26 images an arbitrary position over frame section 40. As shown in FIG. 1, imaging device 28 is disposed between substrate conveyance and holding device 22 and component feeding device 30 over frame section 40 in such a state that imaging device 28 is directed upwards. As a result, imaging device 28 images components held by suction nozzles 66 of work heads 60, 62.

Component feeding device 30 is disposed at one end portion of frame section 40 in the front-rear direction thereof. Component feeding device 30 includes tray-type component feeding device 78 and feeder-type component feeding device (not shown).

Tray-type component feeding device 78 constitutes a device for supplying components which are rested on a tray. Feeder-type component feeding device constitutes a device for supply components by tape feeders (not shown) and stick feeders (not shown).

Bulk component feeding device 32 is disposed at the other end portion of frame section 40 in the front-rear direction thereof. Bulk component feeding device 32 constitutes a device for aligning multiple components, which are scattered in bulk, to have a proper orientation for supply and then supplying the components in the aligned state. That is, bulk component feeding device 32 constitutes the device for aligning multiple components with arbitrary postures to have a predetermined posture for supply, and then supplying the components with the predetermined posture. Hereinafter, the configuration of bulk component feeding device 32 will be described in detail. In high level, components supplied by component feeding device 30 and bulk component feeding device 32 are variant components, and more specifically, components supplied by these component feeding devices are, for example, electronic circuit components, solar cell constituent components, power module constituent components, and the like. Such electronic circuit components include a component with leads, a component without leads, and the like.

Figure 3:
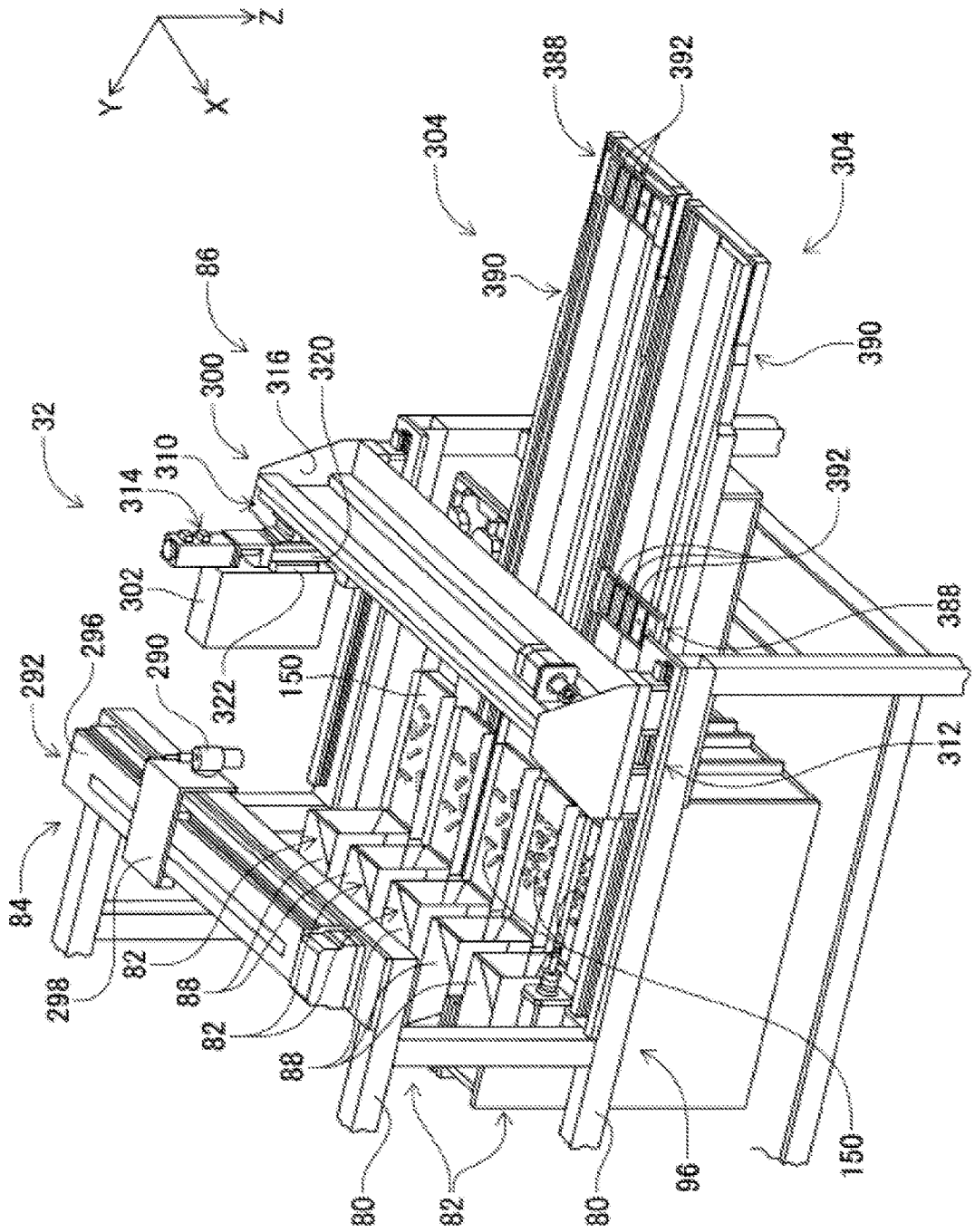
FIG. 3 is a perspective view showing a bulk component feeding device.

As shown in FIG. 3, bulk component feeding device 32 includes main body 80, component supply units 82, imaging device 84, and component delivery device 86.

(a) Component Supply Unit

Component supply unit 82 includes component supplier 88, component scattering device (refer to FIG. 4) 90, and component return device (refer to FIG. 4) 92, and component supplier 88, component scattering device 90, and component return device 92 are integrated into component supply unit 80. Component supply unit 82 is detachably assembled to base 96 of main body 80, and bulk component feeding device 32 has five component supply units 82 which are aligned in a row in the X direction.

Figure 4:
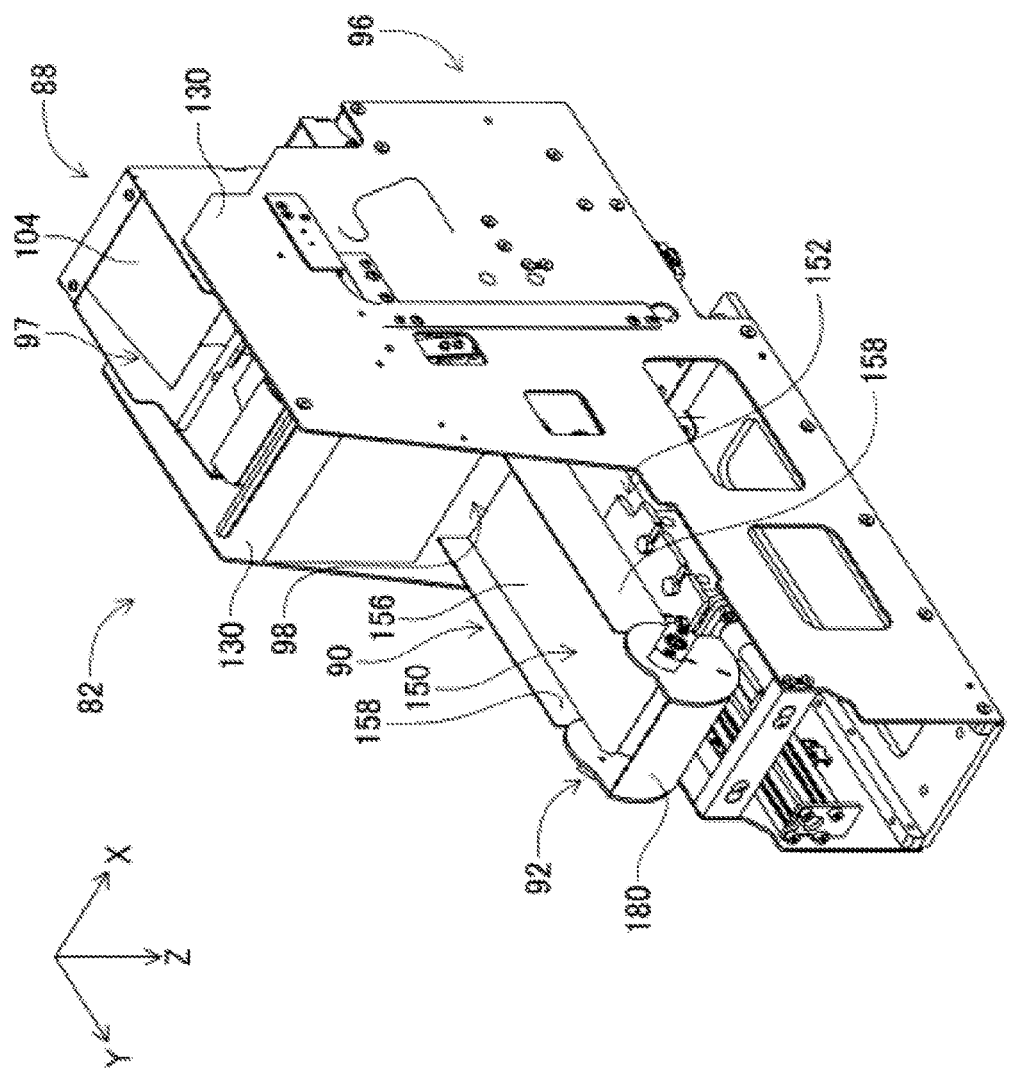
FIG. 4 is a perspective view showing a component supply unit.
Figure 5:
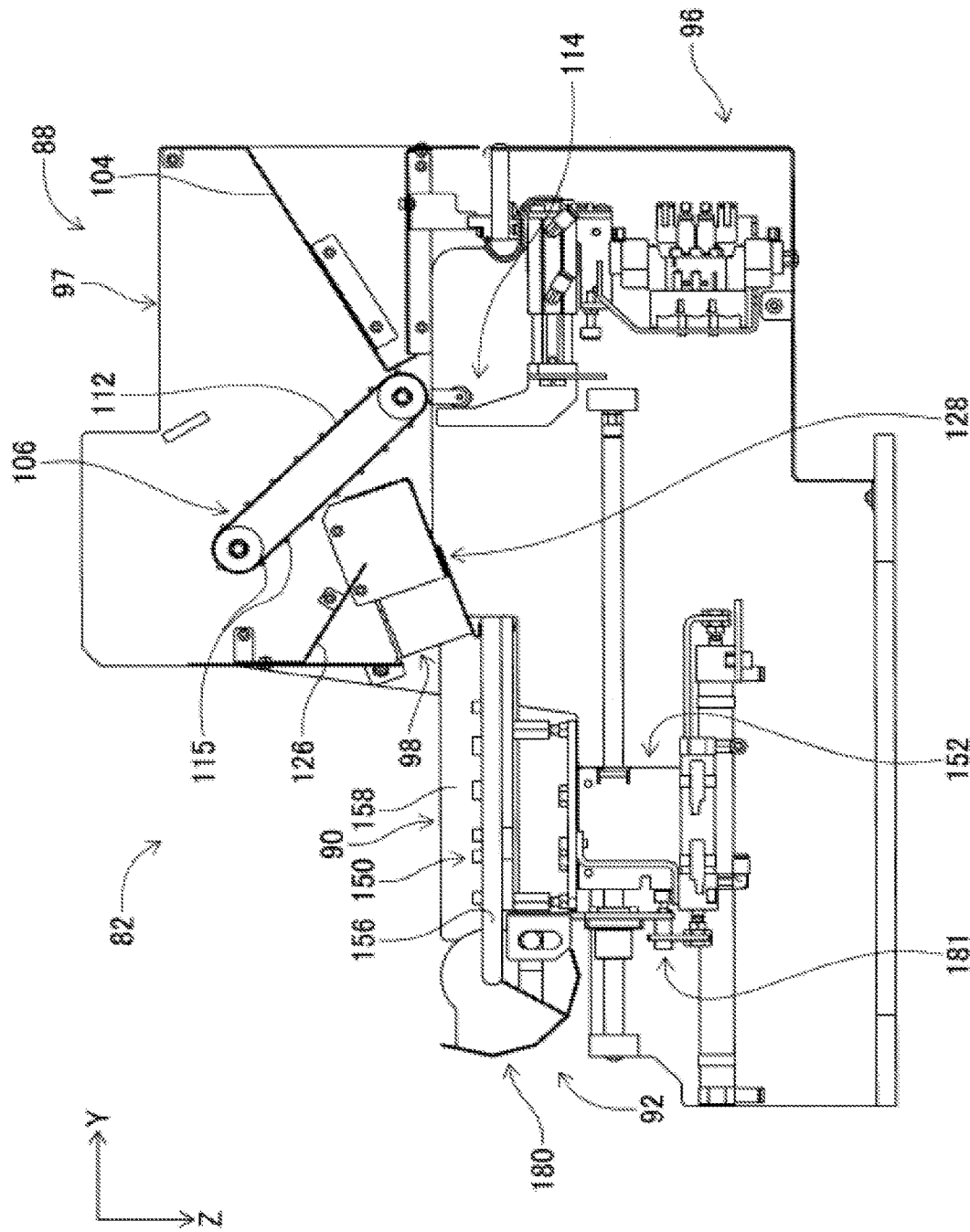
FIG. 5 is a see-through view showing the component supply unit.

In general, component supplier 88 has a rectangular parallelepiped box shape and is disposed in such a manner as to extend in the Y direction as shown in FIGS. 4 and 5. The Y direction is referred to as a front-rear direction of component supplier 88, and in component supply unit 82, a direction towards an end where component return device 92 is disposed is referred to as a front, while a direction towards an end where component supplier 88 is disposed is referred to as a rear.

Component supplier 88 is opened at an upper surface and a front surface, and an opening in the upper surface constitutes a component supply port 97, while an opening in the front surface constitutes a component discharge port 98. In component supplier 88, an inclined plate 104 is disposed below supply port 97. Inclined plate 104 is disposed in such a manner as to be inclined downwards from a rear end face of component supplier 88 towards a center thereof.

As shown in FIG. 5, a conveyor device 106 is disposed at a front side of inclined plate 104. Conveyor device 106 is disposed in such a manner as to be inclined upwards from a front end portion of inclined plate 104 towards the front of component supplier 88. Conveyor belt 112 of conveyor device 106 turns counterclockwise as seen in FIG. 5. That is, a conveyance direction of components by conveyor device 106 is an obliquely upward direction starting from the front end portion of inclined plate 104 towards the front. In addition, multiple protruding sections 115 are formed on a front surface, that is, a conveyance surface of conveyor belt 112 in such a manner as to extend in a width direction of conveyor belt 112. Multiple protruding sections 115 are formed at constant intervals in the turning direction of conveyor belt 112, and the interval is made longer than a lengthwise direction of a component supplied by component supplier 88.

Inclined plate 126 is disposed below a front end portion of conveyor device 106. Inclined plate 126 is disposed to extend from a front end face of component supplier 88 towards below conveyor device 106, and a rear end portion thereof is inclined downwards. Further, inclined plate 128 is also disposed below inclined plate 126. Inclined plate 128 is inclined downwards from a central portion of conveyor device 106 towards discharge port 98 of component supplier 88 in such a manner that a front end portion thereof is positioned lower or downwards.

Additionally, as shown in FIG. 4, a pair of side frame sections 130 are assembled to base 96. A pair of side frame sections 130 are erected so as to face parallel to each other while extending in the Y direction. A distance defined between the pair of side frame sections 130 is made slightly greater than a widthwise dimension of component supplier 88, so that component supplier 88 is removably installed between the pair of side frame sections 130.

Component scattering device 90 includes component support member 150 and component support member moving device 152. Component support member 150 is made up of stage 156 and a pair of side wall sections 158. In general, stage 156 has a long plate-like shape and is disposed in such a manner as to extend forwards from below component supplier 88 installed between a pair of side frame sections 130. Incidentally, an upper surface of stage 156 is generally horizontal and is disposed in such a manner as to define a slight clearance between a front end portion of inclined plate 128 of component supplier 88 and itself, as shown in FIG. 5. As shown in FIG. 4, a pair of side wall sections 158 are fixed to respective longitudinal side sections of stage 156 in such a manner as to be erected therefrom, and respective upper ends of side wall sections 158 extend further upwards than the upper surface of stage 156.

Component support member moving device 152 slides component support member 150 in the Y direction as a result of the operation of air cylinder (refer to FIG. 11) 166. As this occurs, component support member 150 moves between a retracted state (refer to FIG. 6) in which component support member 150 is retracted underneath component supplier 88 and an exposed state (refer to FIG. 5) in which component support member 150 is exposed from underneath component supplier 88.

Figure 7:
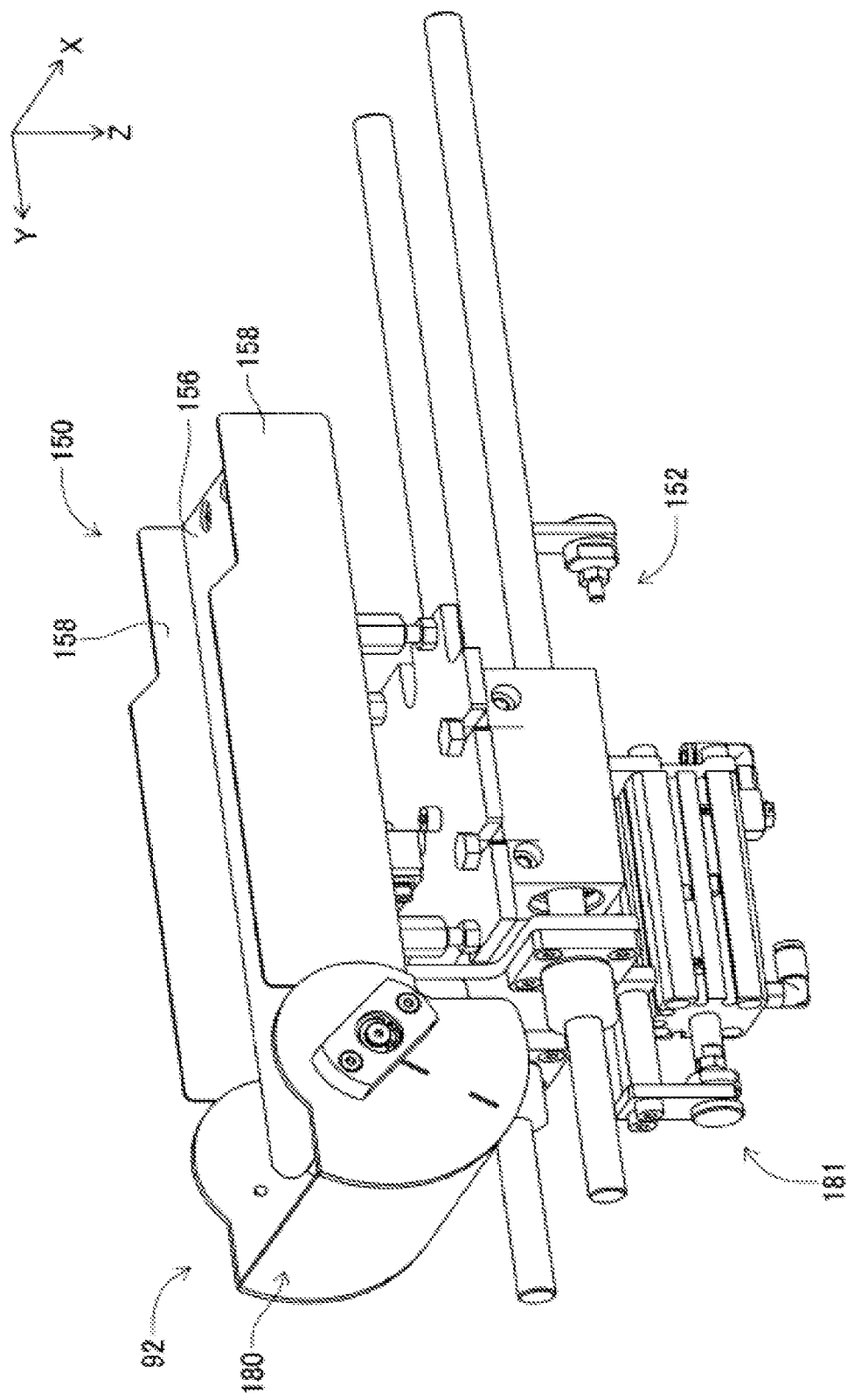
FIG. 7 is a perspective view showing a component scattering device.
Figure 8:
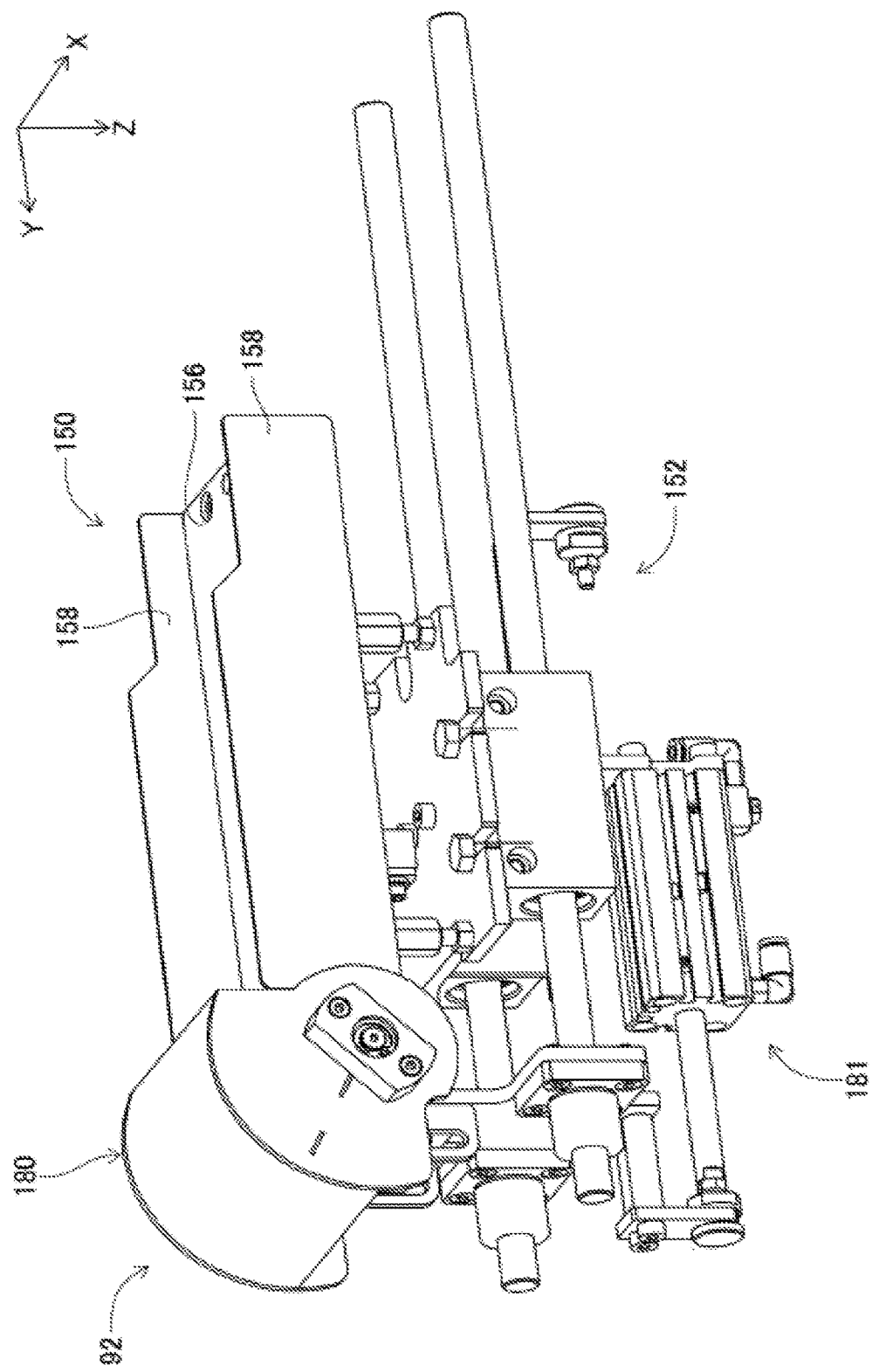
FIG. 8 is a perspective view showing the component scattering device.

As shown in FIG. 7, component return device 92 includes component storage container 180 and container swing device 181. In general, component storage container 180 has a box-like shape, and a bottom surface thereof is curved into an arc shape in an end view. Component storage container 180 is held in a swingable manner at a front end portion of stage 156 of component support member 150 and swings as a result of the operation of container swing device 181. As this occurs, component storage container 180 swings between a storing posture (refer to FIG. 7) in which an opening thereof is directed upwards and a return posture (refer to FIG. 8) in which the opening is directed towards the upper surface of stage 156 of component support member 150.

(b) Imaging Device

As shown in FIG. 3, imaging device 84 includes camera 290 and camera moving device 292. Camera moving device 292 includes guide rail 296 and slider 298. Guide rail 296 is fixed to main body 80 in such a manner as to extend in a widthwise direction (the X direction) of bulk component feeding device 32 above component supplier 88. Slider 298 is attached to guide rail 296 in such a manner as to slide thereon and slides to an arbitrary position as a result of the operation of electromagnetic motor (refer to FIG. 11) 299. In addition, camera 290 is mounted on slider 298 in such a state that camera 290 is directed downwards.

(c) Component Delivery Device

As shown in FIG. 3, component delivery device 86 includes component holding head moving device 300, component holding head 302, and two shuttle devices 304.

Component holding head moving device 300 includes X-direction moving device 310, Y-direction moving device 312, and Z-direction moving device 314. Y-direction moving device 312 includes Y slider 316 which is disposed in such a manner as to extend in the X direction above component supply units 82, and Y slider 316 moves to an arbitrary position in the Y direction as a result of electromagnetic motor (refer to FIG. 11) 319 being driven accordingly. X-direction moving device 310 includes X slider 320 disposed on a side surface of Y slider 316, and X slider 320 moves to an arbitrary position in the X direction as a result of electromagnetic motor (refer to FIG. 11) 321 being driven accordingly. Z-direction moving device 314 includes Z slider 322 disposed on a side surface of X slider 320, and Z slider 322 moves to an arbitrary position in the Z direction as a result of electromagnetic motor (refer to FIG. 11) 323 being driven accordingly.

Figure 9:
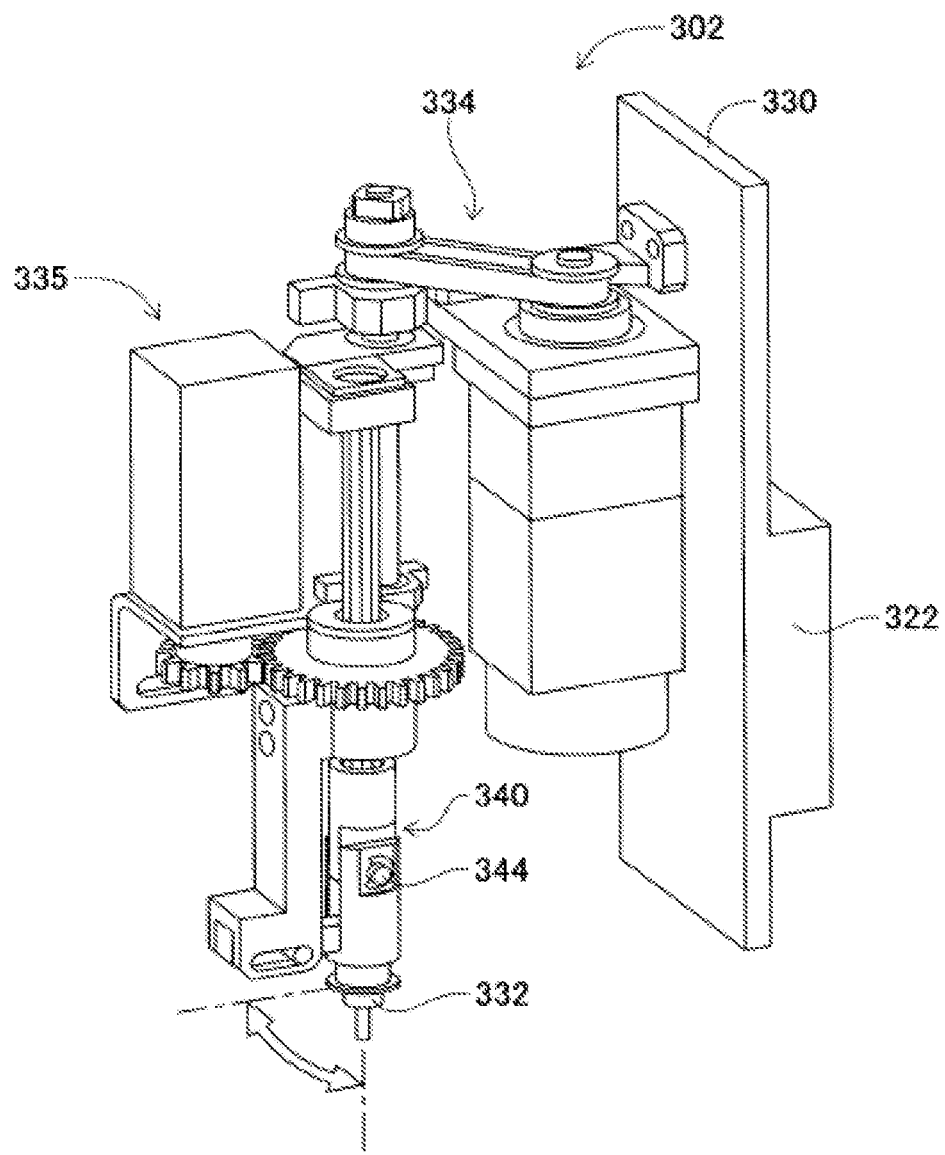
FIG. 9 is a perspective view showing a component holding head.

As shown in FIG. 9, component holding head 302 includes head main body 330, suction nozzle 332, nozzle turning device 334, and nozzle rotation device 335. Head main body 330 is formed integrally with Z slider 322. Suction nozzle 332 holds a component through suction and is detachably attached to a lower end portion of holder 340. Holder 340 is allowed to be bent on support shaft 344, whereby holder 340 is bent upwards through 90 degrees as a result of nozzle turning device 334 operating accordingly. As a result, suction nozzle 332, which is attached to the lower end portion of holder 340, turns through 90 degrees to be positioned in a turned position. That is, suction nozzle 332 turns between a non-turned position and the turned position as a result of nozzle turning device 334 operating accordingly. Suction nozzle 332 can, of course, be stopped to be positioned at an angle between the non-turned position and the turned position. Additionally, nozzle rotation device 335 rotates suction nozzle 332 around its own axis.

As shown in FIG. 3, two shuttle devices 304 each include component carrier 388 and component carrier moving device 390 and are fixed to main body 80 in such a manner as to be aligned side by side in a lateral direction ahead of component supply units 82. Component carrier 388 includes five component receiving members 392 which are arranged side by side in a row in the lateral direction, and components are placed individually in component receiving members 392.

Figure 10:
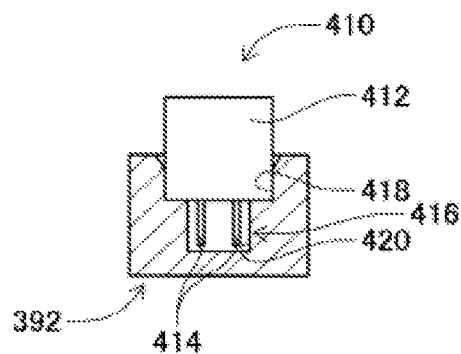
FIG. 10 is a diagram showing a component receiving member with a lead component stored properly therein.

Bulk component feeding device 32 can supply various types of components, and, hence, various types of component receiving members 392 are prepared so as to receive components of various configurations. Here, component receiving member 392 will be described which is configured to receive electric component 410 with leads as shown in FIG. 10, as an electronic circuit component supplied by bulk component feeding device 32. Lead component 410 is made up of component main body 412 having a block-like shape and two leads 414 which project from a bottom surface of component main body 412.

Component receiving member 392 has formed therein component receiving recess section 416 having a shape corresponding to the configuration of lead component 410. Component receiving recess section 416 constitutes a recess section having a step-like shape, and is made up of main body receiving recess section 418, which is opened in an upper surface of component receiving member 392, and lead receiving recess section 420 which is opened in a bottom surface of main body receiving recess section 418. Then, lead component 410 is inserted into an interior of component receiving recess section 416 with leads 414 adopting a posture in which they are directed downwards. As a result, lead component 410 is placed in the interior of component receiving recess section 416 with leads 414 inserted in lead receiving recess section 420 and component main body 412 inserted in main body receiving recess section 418.

Component carrier moving device 390 is a plate-like longitudinal member and is disposed at a front side of component supply unit 82 in such a manner as to extend in the front-rear direction, as shown in FIG. 3. Component carrier 388 is disposed on an upper surface of component carrier moving device 390 in such a manner as to slide in the front-rear direction, whereby component carrier 388 slides to an arbitrary position in the front-rear direction as a result of electromagnetic motor (refer to FIG. 11) 430 being driven accordingly. Incidentally, when component carrier 388 slides in a direction in which component carrier 388 moves close to component supply unit 82, component carrier 388 slides to a component receiving position which is situated within a moving range of component holding head 302 within which component holding head 302 is moved by component holding head moving device 300. On the other hand, when component carrier 388 slides away from component supply unit 82, component carrier 388 slides to a component supply position which is situated within a moving range of working heads 60, 62 within which working heads 60, 62 are moved by work head moving device 64.

Figure 11:
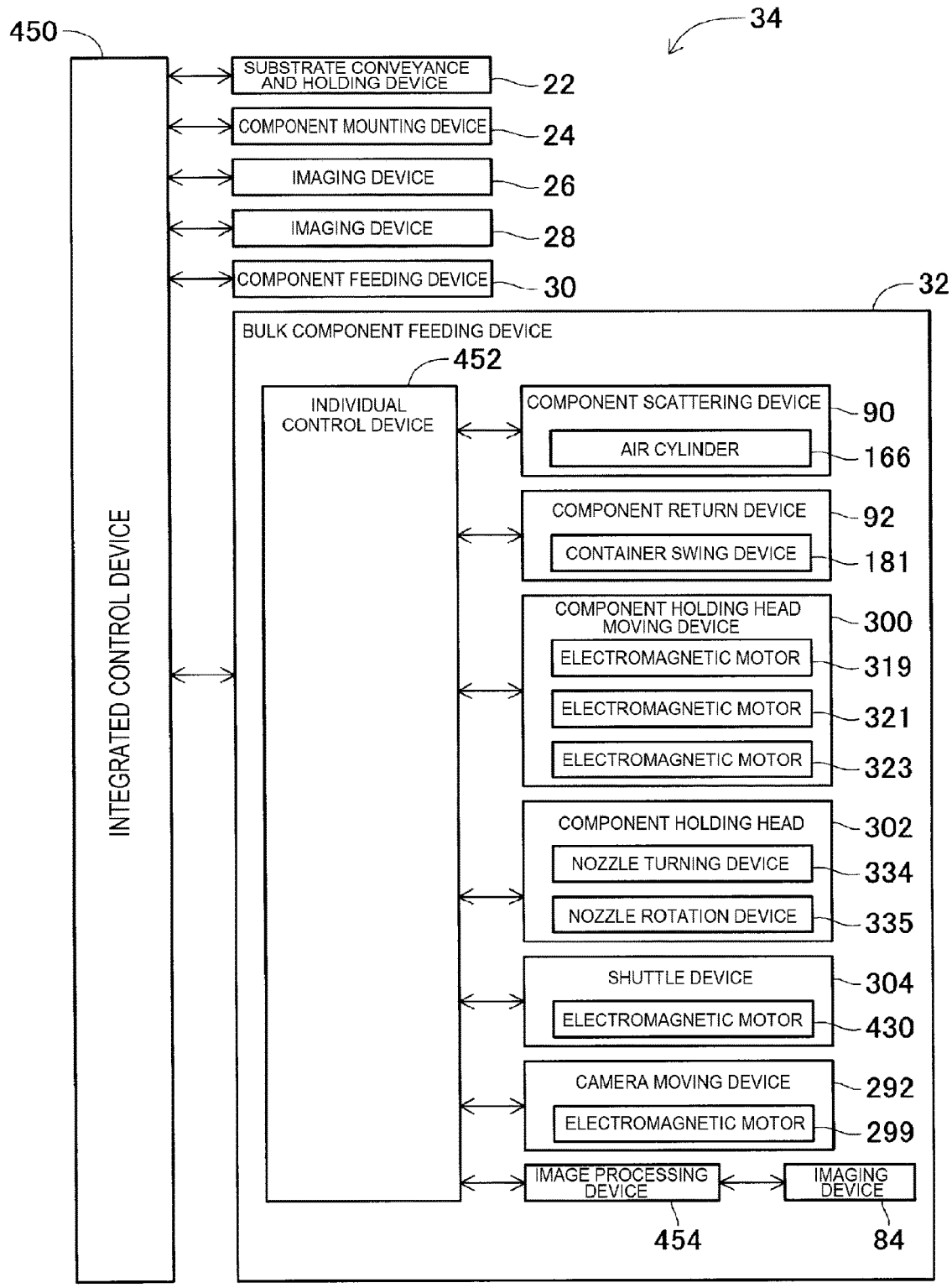
FIG. 11 is a block diagram showing a control device of the component mounting machine.

As shown in FIG. 11, control device 34 includes integrated control device 450, multiple individual control devices (only one control device is shown in FIG. 1) 452, and image processing device 454. Integrated control device 450 is made up mainly of a computer and is connected to substrate conveyance and holding device 22, component mounting device 24, imaging device 26, imaging device 28, component feeding device 30, and bulk component feeding device 32. As a result, integrated control device 450 supervises and controls substrate conveyance and holding device 22, component mounting device 24, imaging device 26, imaging device 28, component feeding device 30, and bulk component feeding device 32. Multiple individual control devices 452 are each made up mainly of a computer and are provided separately for substrate conveyance and holding device 22, component mounting device 24, imaging device 26, imaging device 28, component feeding device 30, and bulk component feeding device 32 (in the figure, only individual control device 452 for bulk component feeding device 32 is shown).

Individual control device 452 for bulk component feeding device 32 is connected to component scattering devices 90, component return devices 92, camera moving device 292, component holding head moving device 300, component holding head 302, and shuttle devices 304. As a result, individual control device 452 for bulk component feeding device 32 controls component scattering devices 90, component return devices 92, camera moving device 292, component holding head moving device 300, component holding head 302, and shuttle devices 304. Image processing device 454 is connected to imaging device 84 for processing captured image data that is captured by imaging device 84. Image processing device 454 is connected to individual control device 452 for bulk component feeding device 32. As a result, individual control device 452 for bulk component feeding device 32 acquires captured image data that is captured by imaging device 84.

(B) Operation of Component Mounting Machine

Having the configuration that has been described heretofore, component mounting machine 10 performs mounting work of mounting components on circuit substrate 12 held by substrate conveyance and holding device 22. Specifically, circuit substrate 12 is conveyed to a working position and is fixedly held by clamping device 52 in the working position. Next, imaging device 26 moves to a position lying above circuit substrate 12 and images circuit substrate 12. As a result, information on an error in holding position of circuit substrate 12 is obtained. Component feeding device 30 or bulk component feeding device 32 supplies components in a predetermined supply position. A component supply operation by bulk component feeding device 32 will be described in detail later. Then, either of working heads 60, 62 moves to a position lying above the component supply position and holds a component by suction nozzle 66 thereof through suction. Subsequently, working head 60 or 62 that holds the component moves to a position lying above imaging device 28, whereby the component held by suction nozzle 66 is imaged by imaging device 28. As a result, information on an error in holding position of the component is obtained. Then, working head 60 or 62 that holds the component moves to a position lying above circuit substrate 12 and mounts the component held thereby on circuit substrate 12 by correcting the error in holding position of circuit substrate 12 and the error in holding position of the component.

(C) Operation of Bulk Component Feeding Device (a) Supply of Lead Components by Bulk Component Feeding Device The operator supplies lead components 410 into bulk component feeding device 32 from supply ports 97 of component suppliers 88, and lead components 410 so supplied are supplied while being placed on component receiving members 392 of component carriers 388 as a result operation of component supply units 82 and component delivery device 86.

To describe this in detail, the operator supplies lead components 410 from supply port 97 in the upper surface of component supplier 88. At this time, component support member 150 is moved to lie below component supplier 88 as a result of operation of component support member moving device 152, whereby component support member 150 is pulled in the retracted state (refer to FIG. 6). With component support member 150 staying in the retracted state, component storage container 180 disposed at the front end of component support member 150 is situated at the front of component supplier 88, adopting a posture (a storing posture) in which the opening of component storage container 180 is directed upwards.

Figure 6:
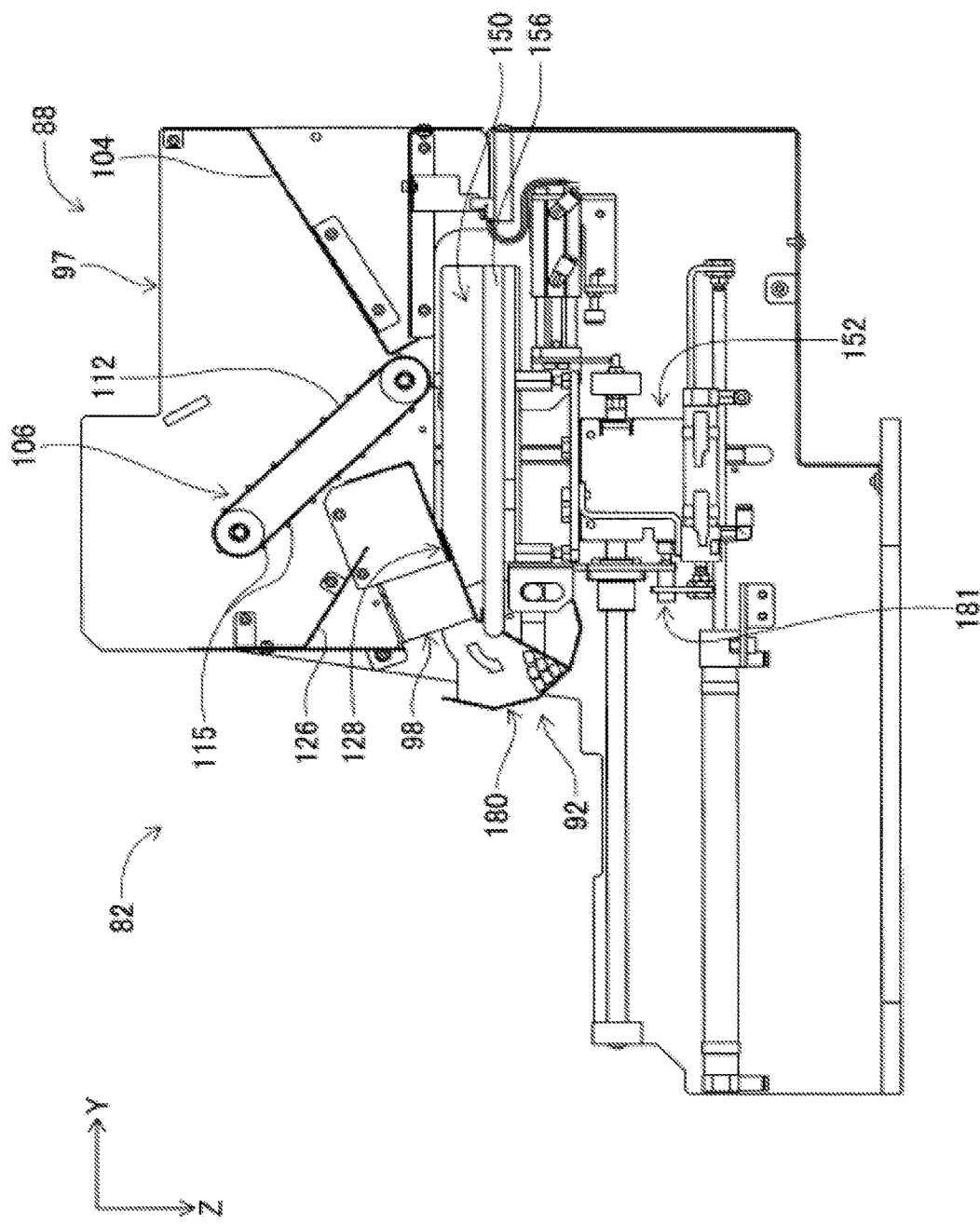
FIG. 6 is a see-through view showing the component supply unit.

Lead components 410 supplied from supply port 97 of component supplier 88 fall on inclined plate 104 of component supplier 88 and roll down to a front lower end of inclined plate 104. As this occurs, lead components 410, which have rolled down to the front lower end of inclined plate 104, are accumulated between the front lower end of inclined plate 104 and a rear lower end of conveyor device 106. Then, as a result of conveyor device 106 being activated to operate, conveyor belt 112 of conveyor device 106 turns counterclockwise as seen in FIG. 6. At this time, in lead components 410 accumulated between inclined plate 104 and conveyor belt 112, a predetermined number of lead components 410 enter between adjacent protruding sections 115 on conveyor belt 112, whereby multiple lead components 410, which are now staying between adjacent protruding sections 115, are conveyed obliquely upwards by conveyor belt 112.

Then, lead components 410, which have been so conveyed by conveyor belt 112, fall on inclined plate 126 from a front upper end of conveyor device 106. Lead components 410, which have so fallen on inclined plate 126, roll down to the rear on inclined plate 126 to fall on inclined plate 128. Lead components 410, which have so fallen on inclined plate 128, roll down to the front and are then discharged from discharge port 98 at the front side of component supplier 88.

As a result, lead components 410, which are discharged from discharge port 98 of component supplier 88, are stored in an interior of component storage container 180. Then, when the predetermined amount of lead components 410 are discharged from component supplier 88, that is, when conveyor device 106 operates a certain amount, conveyor device 106 stops. Next, component support member 150 moves to the front from the retracted state as a result of operation of component support member moving device 152.

Then, container swing device 181 of component return device 92 is activated to operate at a timing at which component support member 150 moves a predetermined amount from the retracted state to the front towards the exposed state, whereby component storage container 180 swings. As a result, the posture of component storage container 180 changes forcibly from the posture in which the opening is directed upwards (the storing posture) to a posture in which the opening is directed towards stage 156

(a returning posture). As this occurs, lead components 410 stored in component storage container 180 are discarded forcibly onto stage 156. As a result, lead components 410, which have been so discarded onto stage 156 from component storage container 180, are then scattered on stage 156. In addition, the swing action of the component storage container is set so as to be completed before component support member 150 is completely exposed so as not to extend a cycle time.

When lead components 410 are scattered from component supplier 88 onto stage 156 of component support member 150 by following the procedure that has been described heretofore, camera 290 of imaging device 84 moves to a position lying above component support member 150, as a result of operation of camera moving device 292, and images lead components 410. Then, based on the captured image data, multiple lead components 410 scattered on the upper surface of component support member 150 are divided into lead components that can be picked up by suction nozzle 332, and lead components that cannot be picked up by suction nozzle 332. The lead component that can be picked up by suction nozzle 332 is referred to as a pickup target component, while the lead component that cannot be picked up by suction nozzle 332 is referred to as a non-pickup target component.

A classifying method for classifying components into pickup target components and non-pickup target components will be described briefly in which lead component 410 an upwardly directed surface of which constitutes an irregular surface or the like which makes it difficult for lead component 410 to be picked up, lead component 410 which is partly covered by another lead component 410, lead component 410 which lies too close to side wall section 158 to be picked up, and the like are classified into non-pickup target components, while remaining lead components 410 are classified into pickup target components. Further, pieces of information about lead components 410 on, such as the positions on component support member 150, postures thereof and the like, are acquired based on the captured image data for lead components 410 classified into pickup target components.

Then, component holding head 302 moves to a position lying above the pickup target component based on the acquired information on the pickup target components, and as a result of operation of component holding head moving device 300, the relevant pickup target component is picked up and held through suction by suction nozzle 332. When the pickup target component is picked up and held through suction by suction nozzle 332, suction nozzle 332 is situated in the non-turned position.

Next, component holding head 302 moves to a position lying above component carrier 388 after lead component 410 has been held by suction nozzle 332. As this occurs, component carrier 388 moves to the component receiving position as a result of operation of component carrier moving device 390. When component holding head 302 moves to the position lying above component carrier 388, suction nozzle 332 is turned to the turned position. Suction nozzle 332 turns so that leads 414 of lead component 410 held by suction nozzle 332 in the turned position are directed downwards in the vertical direction as a result of operation of nozzle turning device 334.

When component holding head 302 moves to the position lying above component carrier 388, lead component 410, whose leads 414 are directed downwards in the vertical direction, is inserted into component receiving recess section 416 of component receiving member 392. As a result, as shown in FIG. 10, lead component 410 is placed in component receiving member 392 with leads 414 kept directed downwards in the vertical direction.

Then, when lead component 410 is so placed in component receiving member 392, component carrier 388 moves to the component supply position as a result of operation of component carrier moving device 390. Since component carrier 388, which has so moved to the component supply position, is then situated within the moving range of working heads 60, 62, in bulk component feeding device 32, lead component 410 is supplied to component mounting machine 10 in the component supply position. In this way, in bulk component feeding device 32, lead components 410 are supplied with leads 414 directed to face downwards and upper surfaces opposite to bottom surfaces to which leads 414 are connected directed to face upwards. Due to this, suction nozzles 66 of work heads 60, 62 can hold lead components 410 properly.

(b) Storing of Lead Components in Component Storage Container

In bulk component feeding device 32, as pickup target components are kept scattered on stage 156 of component support member 150, the scattered pickup target components are repeatedly picked up, and then, the pickup target components so picked up are placed in component receiving members 392 accordingly. Then, component carrier 388 including component receiving members 392 mounted thereon is moved to the component supply position, whereby lead components 410 are supplied as set. However, with no pickup target components scattered on stage 156 of component support member 150, no lead component 410 can be picked up from stage 156. That is, with all lead components 410 determined as pickup acceptable components having been picked up, leaving lead components 410 determined as pickup unacceptable components or lead components 410 determined to be unavailable for determination on stage 156, no lead component 410 can be picked up from stage 156.

To deal with such a case, in bulk component feeding device 32, lead components 410 left unpicked on stage 156 are recovered into component storage container 180. Then, lead components 410, which have been recovered into component storage container 180, are scattered again on stage 156 in such a manner that lead components 410 adopt different postures, whereby picking up of lead components 410 from stage 156 is resumed.

Specifically, when all pickup target components on stage 156 are picked up, component support member 150 moves towards the retracted position underneath component carrier 88 as a result of operation of component support member moving device 152. That is, component support member 150 moves from the exposed state (refer to FIG. 5) towards the retracted state (refer to FIG. 6). As this occurs, component storage container 180, which is disposed at the front end portion of component support member 150, is adopting the posture (a recovery posture) in which the opening is directed upwards. When component support member 150 moves from the exposed state towards the retracted state, lead components 410 on stage 156 of component support member 150 are held back by a front end portion of inclined plate 128 of component carrier 88.

Further, as shown in FIG. 6, when component support member 150 has moved to reach the retracted state, lead components 410 on stage 156 are swept off to fall into an interior of component storage container 180. As a result, lead components 410 on stage 156 are recovered into component storage container 180. When lead components 410 on stage 156 are recovered into component storage container 180 in the way described above, lead components 410 so recovered are replenished onto stage 156.

To describe this in detail, when the recovery of lead components 410 into component storage container 180 is completed, component support member 150 is then in the retracted state as shown in FIG. 6. Due to this, component support member 150 moves from the retracted state to the front as a result of operation of component support member moving device 152. Then, container swing device 181 of component return device 92 is activated to operate at a timing at which component support member 150 moves a predetermined amount from the retracted state to the front towards the exposed state, whereby component storage container 180 swings. As a result, the posture of component storage container 180 changes forcibly from the posture in which the opening is directed upwards (the storing posture) to a posture in which the opening is directed towards stage 156 (a returning posture).

As this occurs, lead components 410 stored in component storage container 180 are discarded forcibly onto stage 156. As a result, lead components 410, which have been so discarded onto stage 156 from component storage container 180, are then scattered on stage 156. That is, lead components 410 recovered into component storage container 180 are replenished onto stage 156. As a result, the postures of lead components 410 so replenished are changed, enabling lead components 410 to be picked up again from the upper surface of stage 156.

(c) Replenishment of Lead Components from Component Supplier onto Stage

Further, when lead components 410 are repeatedly stored from stage 156 into component storage container 180 and lead components 410 are repeatedly replenished from component storage container 180 onto stage 156, the number of lead components 410 scattered on stage 156 is reduced. Thus, when the number of lead components 410 scattered on stage 156 is reduced, lead components 410 are replenished from component supplier 88.

Specifically speaking, in order to replenish lead components 410 from component supplier 88, the number of lead components 410 left scattered on stage 156 needs to be recognized. Then, an occupation ratio of stage 156 by lead components 410 is used as an index value for estimating the number of lead components 410 scattered on stage 156.

To describe this in detail, stage 156 is imaged by camera 290 before lead components 410 are stored from stage 156 into component storage container 180. Then, in the area of stage 156 on which lead components 410 are scattered, an area of portions where lead components 410 are not placed is calculated based on captured image data. That is, an area of portions where stage 156 is exposed (hereinafter, referred to as an "exposed area") is calculated. Specifically speaking, for example, when stage 156 is white color while lead components 410 are black color, the portions recognized as white are extracted based on the captured image data acquired by camera 290, and an area of the portions so extracted is calculated as the exposed area.

Stage 156 is imaged by camera 290 before lead components 410 are scattered on stage 156, that is, in such a state that nothing is placed on stage 156. Then, an area of stage 156 (hereinafter, referred to as a "stage area") is calculated based on the acquired captured image data. That is, for example, when stage 156 is white color, white portions are extracted based on the captured image data, and an area of the portions so extracted is calculated as the stage area.

Then, an area occupied by lead components 410 scattered on stage 156 (hereinafter, referred to as a "component occupation area") is calculated by subtracting the exposed area from the stage area. Next, a ratio of an area occupied by lead components 410 to a total area of stage 156, that is, an occupation ratio of stage 156 by lead components 410 (hereinafter, referred to as a "component occupation ratio) is calculated by calculating a ratio of the component occupation area to the stage area. A higher component occupation ratio denotes that the number of lead components 410 scattered on stage 156 becomes greater, while a lower occupation ratio denotes that the number of lead components 410 scattered on stage 156 becomes smaller. As a result, the component occupation ratio can be used as an index value for estimating the number of lead components 410 scattered on stage 156.

As a result, when a calculated component occupation ratio becomes a threshold or smaller, it is estimated that the number of lead components 410 scattered on stage 156 becomes a predetermined number or smaller, components are replenished onto stage 156 from component supplier 88. Specifically speaking, when the calculated component occupation ratio becomes the threshold or smaller, component support member 150 moves from the exposed state towards the retracted state as a result of operation of component support member moving device 152. As this occurs, lead components 410 are supplied from component supplier 88 at that timing. Since the supply work of supplying lead components 410 from component supplier 88 has already been described before, a detailed description thereof will be omitted here.

That is, when the calculated component occupation ratio becomes the threshold or smaller, lead components 410 are supplied onto stage 156 from component supplier 88 while stage 156 is moving from the exposed state towards the retracted state. As a result, lead components 410 supplied onto stage 156 from component supplier 88 and lead components 410 having been left on stage 156 since before lead components 410 are supplied from component supplier 88 are stored in component storage container 180. Then, lead components 410 stores in component storage container 180 are then scattered on stage 156 according to the procedure described above. As a result, when the number of lead components 410 remaining on stage 156 is reduced, lead components 410 are replenished from component supplier 88 at that timing, whereby lead components 410 can continue to be picked up from stage 156.

Lead components 410 having remained on stage 156 and components supplied from component supplier 88 are once stored in component storage container 180, and then, the components so stored in component storage container 180 are scattered on the stage again. Thus, the components that are replenished onto stage 156 include the components that have been left on stage 156 since before the components are stored in component storage container 180. Component supplier 88 and component storage container 180 function as a replenishing device.

(d) Adjustment of Number of Lead Components on Stage

As described above, when the component occupation ratio becomes the threshold or smaller, lead components 410 are supplied from component supplier 88 onto stage 156, whereby lead components 410 are allowed to continue to be picked up from stage 156. However, in the event that the threshold is set uniform irrespective of types of lead components 410, there is a possibility that lead components 410 scattered on stage 156 come to overlap one another.

Figure 12:
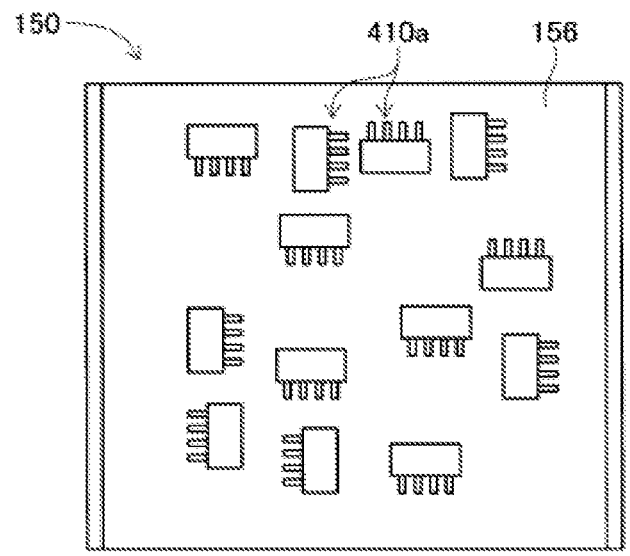
FIG. 12 is a view showing a stage on which lead components of small dimensions are scattered.

Specifically speaking, for example, as shown in FIG. 12, when a component occupation ratio of lead components 410a of a small size becomes threshold A or smaller, a relatively large clearance is defined between adjacent lead components 410a. Due to this, when the component occupation ratio of lead components 410a of a small size becomes threshold A or smaller, even though lead components 410a are replenished from component supplier 88, there still remains room where lead components 410a replenished newly can be scattered on stage 156, whereby lead components 410a hardly overlap one another.

Figure 13:
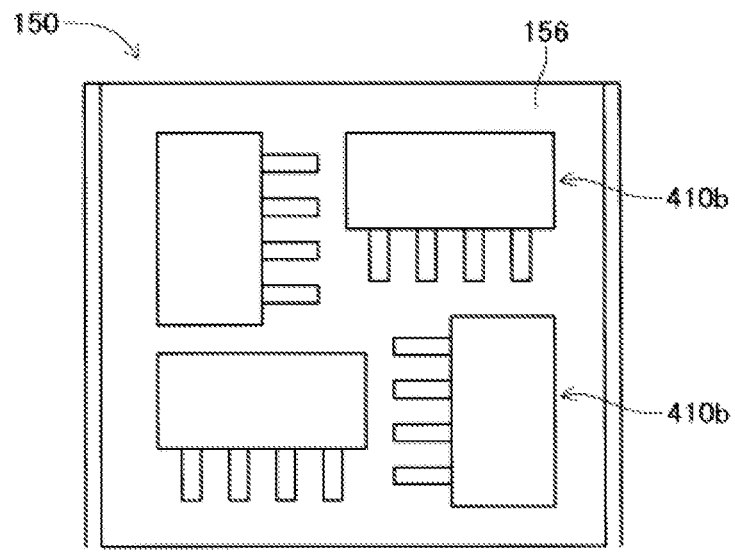
FIG. 13 is a view showing a stage on which lead components of great dimensions are scattered.

On the other hand, as shown in FIG. 13, when a component occupation ratio of lead components 410b of a large size becomes the threshold A or smaller, there remains almost no clearance among adjacent lead components 410b. As a result, in the case that the component occupation ratio of lead components 410b of a large size becomes threshold A or smaller, when lead components 410b are replenished from component supplier 88, there remains no room for lead components 410b replenished newly to be scattered on stage 156, whereby lead components 410b tend to overlap one another easily.

That is, in the case that the component occupation ratio of lead components 410b of a large size becomes threshold A or smaller, when lead components 410b are supplied from component supplier 88, lead components 410b come to overlap one another on stage 156, increasing the probability that lead components 410b so supplied become non-pickup target components. When the probability that lead components 410b become non-pickup target components is increased in this way, the number of times of performing the recovery work of recovering components into component storage container 180 is increased, reducing the work efficiency.

In addition, depending upon a shape of lead component 410 in addition to the size of lead component 410, some lead components 410b overlap one another with ease, while other lead components 410 overlap one another only with great difficulty. As a result, when the component occupation ratio of lead component 410 tending to overlap another lead component 410 only with difficulty becomes threshold A or smaller, even though lead components 410b are replenished from component supplier 88, lead components 410 overlap one another only with great difficulty. On the other hand, in the case that the component occupation ratio of lead component 410 tending to overlap another lead component 410 with ease becomes threshold A or smaller, when lead components 410 are replenished from component supplier 88, lead components 410 come to overlap one another with ease. In other words, lead components of different sizes can also be considered to be lead components of different shapes.

In view of these situations, with bulk component feeding device 32, thresholds are set for types of lead components 410. For example, threshold A1 set for lead component 410b of a large size is set smaller than threshold A2 set for lead component 410a of a small size. That is, with lead components 410a of a large size scattered on stage 156, lead components 410b of a large size are replenished from component supplier 88 in such a state that the number of components remaining on stage 156 is reduced compared with lead components 410a of a small size.

In addition, for example, threshold A3 set for lead component 410 of a shape making it overlap another lead component 410 with ease is set smaller than threshold A4 set for lead component 410 of a shape making it overlap another lead component 410 only with great difficulty. That is, when lead components 410 of a shape making them overlap one another with ease are scattered on stage 156, lead components 410 are replenished from component supplier 88 in such a state that the number of components remaining on stage 156 is reduced compared with lead components 410 of a shape making them overlap one another only with great difficulty. Lead components can be restrained from overlapping one another when the components are replenished from component supplier 88 by setting the thresholds for the types of lead components 410 in the way described above.

However, since the numbers of components replenished from component supplier 88 differ according to types of lead components 410 when lead components 410 are replenished onto stage 156 from component supplier 88, there is a possibility that an appropriate number of lead components 410 cannot be scattered on stage 156 after replenishment. To describe this in detail, component supplier 88 replenishes lead components 410 onto stage 156 as a result of conveyor belt 112 turning accordingly, and as this occurs, conveyor belt 112 turns, for example, a distance corresponding to a dimension defined between two adjacent protruding sections 115 of conveyor belt 112. As a result, lead components 410 staying between two adjacent protruding sections 115 are supplied onto stage 156 from component supplier 88.

Figure 14:
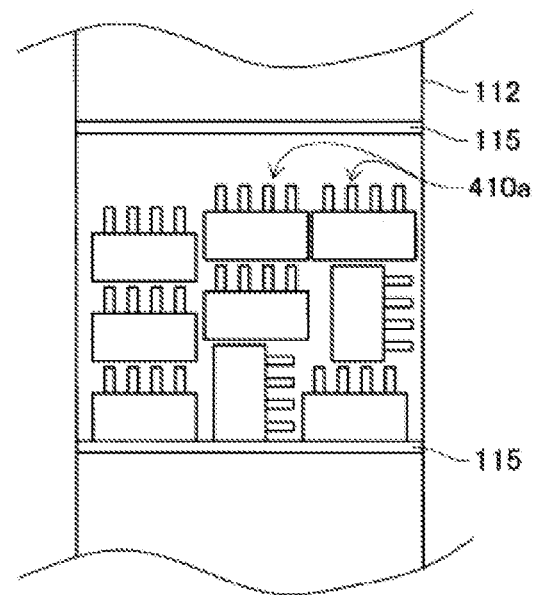
FIG. 14 is a view showing a portion of a conveyor belt where lead components of small dimensions are laid out between two adjacent protruding sections.
Figure 15:
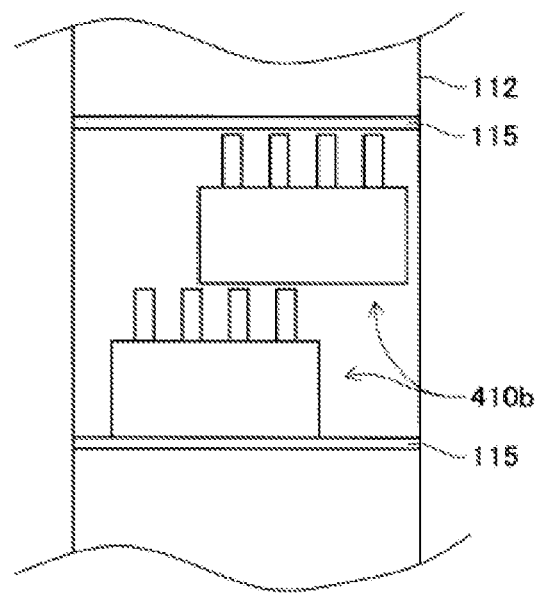
FIG. 15 is a view showing a portion of the conveyor belt where lead components of great dimensions are laid out between two adjacent protruding sections.

Specifically speaking, for example, when lead components 410a of a small size are supplied from the component supply unit 88, as shown in FIG. 14, since nine lead components 410a are supplied to be placed between two adjacent protruding sections 115, nine lead components 410a are supplied from component supplier 88 onto stage 156. On the other hand, when lead components 410b of a large size are supplied from component supplier 88, since two lead components 410b are supplied to be placed between two adjacent protruding sections 115 as shown in FIG. 15, two lead components 410b are supplied from component supplier 88 onto stage 156.

Additionally, since lead components 410 of a shape facilitating overlapping thereof tend to overlap one another with ease between two adjacent protruding sections 115, a relatively large number of lead components 410 fall to be placed therebetween, and such a large number of lead components 410 are supplied from component supplier 88 onto stage 156. On the other hand, since lead components 410 of a shape making them hardly overlap each other tend to overlap each other only with great difficulty between two adjacent protruding sections 115. only a relatively small number of lead components 410 are allowed to fall to be placed therebetween, and such a small number of lead components 410 are supplied from component supplier 88 onto stage 156.

In this manner, in replenishing lead components 410 from component supplier 88, when the turning amount of conveyor belt 112 is set uniform irrespective of the types of components, the replenishing numbers of components replenished from component supplier 88 come to differ according to the types of components to be replenished, whereby an appropriate number of lead components 410 cannot be scattered on stage 156 after replenishment. In view of these situations, turning amounts of conveyor belt 112 for replenishment of components are set for the types of lead components 410 to be replenished.

For example, a turning amount of conveyor belt 112 for replenishment of lead components 410a of a small size is set at a distance corresponding to the dimension defined between two adjacent protruding sections 115 (hereinafter, referred to as a "set distance") in individual control device 452 or integrated control device 450. On the other hand, a turning amount of conveyor belt 112 for replenishment of lead components 410 of a large size is set at a distance five times greater than the set distance. As a result, when components are replenished from component supplier 88 onto stage 156, about nine lead components 410a of a small size are replenished, while about 10 lead components 410b of a large size are replenished. Additionally, the turning amount of conveyor belt 112 for replenishment of lead components 410 of a shape making them hardly overlap one another is set more than the turning amount of conveyor belt 112 for replenishment of lead components 410 of a shape making them overlap one another with ease.

The numbers of components replenished from component supplier 88 onto stage 156 can be made the same in general irrespective of the types of components replenished by setting the turning amounts of conveyor belt 112 according to the types of the components in the way described above. As a result, an appropriate amount of components can be scattered on stage 156 after the components have been replenished from component supplier 88 onto stage 156. Further, the turning amount of the conveyor belt does not have to be limited to a multiple of an integer of the set distance.

For this reason, with bulk component feeding device 32, the number of components scattered on stage 156 can be adjusted appropriately so as to ensure an appropriate component supply by setting the threshold for use in specifying the timing at which components are replenished from component supplier 88 and the turning amounts of conveyor belt 112 for replenishment of components in accordance with the types of components to be replenished.

Additionally, for bulk component feeding device 32, five component supply units 82 are provided as described above. In each of the five component supply units 82 one stage is associated with one component supplier 88, and components are supplied from component supplier 88 which is associated with one stage. As a result, an amount of components on stage 156 can be adjusted for each of the five component supply units 82. That is, in the case that the five component supply units 82 are each provided with different types of components, thresholds for use in specifying timings at which the different types of components are replenished from component suppliers 88 and turning amounts of conveyor belts 112 for replenishment of the different types of components come to differ from stage 156 to stage 156. As a result, an amount of components scattered on stage 156 is adjusted for each of the five component supply units 82. Thus, the amount of components on stage 156 can be adjusted according to the amount of components supplied from each of the five component supply units 82, whereby bulk component feeding device 32 can supply various types of components in a well-balanced manner. That is, components can be supplied accurately in accordance with a required component supply speed.

Further, with bulk component feeding device 32, since the thresholds for use in specifying the timings at which the different types of components are replenished and the turning amounts of conveyor belts 112 for replenishment of the different types of components differ from stage 156 to stage 156, the specific types of components can be replenished from respective component suppliers 88 onto respective stages 156 at an arbitrary timing. A timing at which conveyor belt 112 starts operating for replenishment of components and a timing at which conveyor belt 112 in question stops operating can be adopted as the arbitrary timing. As a result, the component replenishing timing can be a timing based on the number of times of replenishment of components from conveyor belt 112 per unit time.

Incidentally, bulk component feeding device 32 constitutes an example of a component feeding device. Component supplier 88 constitutes an example of a replenishing device. Stage 156 constitutes an example of a stage. Component storing container 180 constitutes an example of the replenishing device. Individual control device 452 constitutes an example of a control device.

The disclosure is not limited to the embodiment that has been described heretofore and hence can be carried out in various modes that are modified and/or improved variously based on the knowledge of those skilled in the art to which the disclosure pertains. Specifically speaking, for example, in the embodiment described above, the amount of components supplied onto stage 156 is adjusted by setting the threshold for use in specifying the timing at which components are replenished from component supplier 88 and the turning amount of conveyor belt 112 for replenishment of components in accordance with the types of components to be replenished. On the other hand, the amount of components supplied onto stage 156 may be adjusted by setting at least one of the threshold and the turning amount of conveyor belt 112 in accordance with the types of components to be replenished.

In the embodiment described above, while one stage is associated with one component supplier, for example, two stages may be associated with three component suppliers. In such a case, components are supplied from two component suppliers associated with a first stage, and components are supplied from a remaining component supplier associated with a second stage.

In the embodiment described above, while the number of components replenished from component supplier 88 is adjusted by setting the turning amount of conveyor belt 112 in accordance with the types of components to be replenished, the number of components replenished from component supplier 88 may be adjusted by setting an operation time of conveyor belt 112 in accordance with the types of components to be replenished. In addition, in the case that a bucket is used in place of conveyor device 106 as the device for supplying components from component supplier 88 onto stage 156, the number of components replenished from component supplier 88 may be adjusted by setting the number of times of supply of components from the bucket in accordance with the types of components to be replenished.

In the embodiment described above, while the component occupation ratio is used as the index value for estimating the number of components scattered on stage 156, the number of components scattered on stage 156 may be used. Specifically speaking, for example, outlines of components having various postures may be distinguished from one another based on the captured image data, so that the number of components scattered on stage 156 is calculated based on the distinguished outlines. In this case, when the number of components so calculated becomes a threshold or smaller, components are replenished from component supplier 88 onto stage 156.

Further, in the embodiment described above, while the total components occupation area is calculated by subtracting the exposed area from the stage area, the total components occupation area may be calculated based on the captured image data. Specifically speaking, for example, when stage 156 is white or bright color, and lead components 410 are black or dark color, portions recognized as black or dark may be extracted based on the captured image data, so that an area of the portions so extracted is calculated as a component occupation area.

Additionally, in the embodiment described above, while the disclosure is applied to lead components 410, the disclosure can be applied to various types of components. Roughly speaking, the disclosure can be applied to profile components, and specifically speaking, the disclosure can be applied to, for example, solar cell constituent components, power module constituent components, electronic circuit components with no lead, and the like.

REFERENCE SIGNS LIST

32: bulk component feeding device (work machine); 82: component supply unit (component feeding device); 88: component supplier (replenishing device); 156: stage

The invention claimed is:

1. A component feeding device comprising:
multiple component replenishing devices configured to replenish with components having different shapes, each of the replenishing devices including a conveyor belt;
multiple stages on which the components replenished from the multiple replenishing devices are scattered, and
a control section including a processor configured to cause the multiple replenishing devices to replenish the components to the respective stages at an arbitrary timing by
obtaining a stage area of the respective stage based on image data acquired before the components are scattered on the respective stage,
calculating an exposed area of the respective stage where the components are not placed based on acquired image data,
calculating a component occupation area of the respective stage that is occupied by the components by subtracting the exposed area of the respective stage from the stage area of the respective stage,
calculating a component occupation ratio of the respective stage based on the component occupation area of the respective stage and the stage area of the respective stage,
comparing the component occupation ratio of the respective stage to a threshold value, the threshold value being based on a size of the components to be replenished, and
replenishing the components to the respective stage by turning the conveyor belt when the component occupation ratio is less than the threshold value,
wherein a turning amount of the conveyor belt is based on the size of the components to be replenished.

2. The component feeding device according to claim 1, wherein the multiple stages are each replenished with the components having different shapes from a corresponding replenishing device of the multiple replenishing devices in association with each of the multiple stages with a one-to-one relationship.

3. The component feeding device according to claim 1, wherein a timing at which the multiple replenishing devices each replenish the components of different shapes to the corresponding stage is a timing based on the number of times of replenishments per unit time.

4. The component feeding device according to claim 1, wherein a number of the components replenished from the replenishing device to a corresponding stage of the multiple stages at one time is set for each of the components of different shapes.

5. The component feeding device according to claim 1, wherein the components scattered on the multiple stages are feedable to the replenishing devices.

6. A component feeding method for supplying components, having different shapes and being respectively replenished onto multiple stages from multiple replenishing devices each including a conveyor belt, to a component mounting device with the components being respectively scattered on the multiple stages, the method comprising:
obtaining a stage area of the respective stage based on image data acquired before the components are scattered on the respective stage;
calculating an exposed area of the respective stage where the components are not placed based on acquired image data;
calculating a component occupation area of the respective stage that is occupied by the components by subtracting the exposed area of the respective stage from the stage area of the respective stage;
calculating a component occupation ratio of the respective stage based on the component occupation area of the respective stage and the stage area of the respective stage;
comparing the component occupation ratio of the respective stage to a threshold value, the threshold value being based on a size of the components to be replenished; and
replenishing the components to the respective stage by turning the conveyor belt when the component occupation ratio is less than the threshold value,
wherein a turning amount of the conveyor belt is based on the size of the components to be replenished.

* * * * *